United States Patent [19]

Sauer

[11] Patent Number: 6,064,257
[45] Date of Patent: May 16, 2000

[54] CHOPPER-STABILIZED OPERATIONAL AMPLIFIER

[75] Inventor: Don Roy Sauer, San Jose, Calif.

[73] Assignee: National Semiconductor Corporation, Santa Clara, Calif.

[21] Appl. No.: 09/205,000

[22] Filed: Dec. 2, 1998

Related U.S. Application Data

[63] Continuation-in-part of application No. 08/810,095, Mar. 3, 1997, Pat. No. 5,926,066.

[51] Int. Cl.[7] ............................................. H03F 1/02
[52] U.S. Cl. ..................................... 330/9; 327/164
[58] Field of Search ............................ 330/9; 327/164, 327/124, 307; 331/78

[56] References Cited

U.S. PATENT DOCUMENTS

| | | | |
|---|---|---|---|
| 3,816,765 | 6/1974 | Goyer | 307/260 A |
| 3,866,128 | 2/1975 | Fletcher et al. | 328/59 |
| 4,175,258 | 11/1979 | Borkowski et al. | 331/78 |
| 5,115,202 | 5/1992 | Brown | 330/9 |
| 5,506,545 | 4/1996 | Andrea | 331/78 |
| 5,600,283 | 2/1997 | Sauer | 331/111 |
| 5,793,242 | 8/1998 | Sauer | 327/336 |

OTHER PUBLICATIONS

Frederiksen, Thomas M., *Intuitive IC OP AMPS*, National Semiconductor Technology Series, 1984, Santa Clara, CA, pp. 8–12.

Horowitz, Paul and Hill, Winfield, *The Art of Electronics*, Cambridge University Press, 1980, New York, pp. 80–86, 286–307.

Jones, Don and Webb, Robert W., "Chopper–Stabilized Op Amp Combines MOS and Bipolar Elements on One Chip", Electronics, Sep. 27, 1973, pp. 110–114.

Smith, Ralph J., *Electronics: Circuits and Devices*, John Wiley and Sons, 1980, New York, pp. 434–457.

*Primary Examiner*—Robert Pascal
*Assistant Examiner*—Henry Choe
*Attorney, Agent, or Firm*—Skjerven, Morrill, MacPherson, Franklin & Friel LLP; David E. Steuber; James E. Parsons

[57] ABSTRACT

A chopper stabilized operational amplifier implemented on a single integrated circuit chip is disclosed. The disclosure includes a symmetrical random signal generator circuit that produces a true random voltage signal upon application of a DC bias current. The true random voltage signal is obtained by amplifying and bandpass filtering random white noise voltages generated by a component on the chip. The random signal generator circuit is employed with a symmetrical oscillator to form a random clock signal generator on the same chip. The amount of time between each clocking pulse output by the random clock signal generator randomly varies within a selected range of time. The random clock signal generator is used to control the amount of time between each switching of a chopper switch in the chopper-stabilized operational amplifier, so that the chopping frequency is truly random. The random signal generator and the random clock signal generator do not create digital noise on a power supply because, for each current or voltage that turns on in those circuits, an equal current or voltage turns off.

15 Claims, 7 Drawing Sheets

CHOPPER-STABILIZED OPERATIONAL AMPLIFIER

CROSS REFERENCE TO RELATED APPLICATIONS

This application is a continuation-in-part of application Ser. No. 08/810,095, which was filed on Mar. 3, 1997 and has the same inventor, now U.S. Pat. No. 5,926,066 which issued on July 20, 1999.

This application is related to three commonly invented and owned U.S. patents: U.S. Pat. No. 5,600,283, entitled "DC Isolated Oscillator," which was issued on Feb. 4, 1997; application Ser. No. 08/527,401, entitled "Floating Capacitor Differential Integrator," which was also filed on Sep. 13, 1995 now U.S. Pat. No. 5,793,242 which issued on Aug. 11, 1998; and application Ser. No. 08/811,063, entitled "Chopper-Stabilized Operational Amplifier Including Low Noise Chopper Switch," which was filed on Mar. 3, 1997 now U.S. Pat. No. 5,959,498 which issued on Sep. 28, 1999. Each of the foregoing applications is incorporated herein by reference in its entirety.

BACKGROUND

1. Field of the Invention

This invention relates to integrated circuits, and in particular to a method and circuit for generating a true random, yet controlled, voltage signal which may be used in clock circuits and chopper-stabilized operational amplifiers.

2. Description of Related Art

Attributes of the present invention may be appreciated by considering the example of a chopper-stabilized operational amplifier, and conventional approaches to improving the performance of such amplifiers.

Operational amplifiers or "op amps" typically have two input terminals: a noninverting terminal (denoted "+") and an inverting terminal (denoted "−"). When both input terminals are grounded, an ideal operational amplifier develops a zero output voltage. Under the same conditions, an actual amplifier will have a finite output because of inevitable small imbalances in the components. The offset voltage of the amplifier equals the DC input voltage required to compensate for such imbalances. Unfortunately, such offset voltages "drift" with changes in temperature and time. This is one of the important sources of error in operational amplifier circuits, because it is dynamic, and cannot easily or necessarily be resolved by the initial design of the op amp.

One approach to compensate for voltage drift is to employ a chopper-stabilizer circuit. The chopper-stabilizer circuit dynamically nulls the offset of a primary op amp. There are a variety of ways to implement a chopper-stabilized operational amplifier. See, e.g., Jones and Webb, "Chopper-Stabilized Op Amp Combines MOS and Bipolar Elements on One Chip," *Electronics,* Sep. 27, 1973, pp. 209–13.

FIG. 1 shows a conventional chopper-stabilized operational amplifier 1, with an auxiliary chopper-stabilizer circuit 17. Primary op amp 10 is typically a high-frequency, wideband amplifier. As shown, op amp 10 has a negative feedback path 16 between its output 18 and its inverting ("−") input terminal. Op amp 10 is also provided with a trim port 11, so that its offset may be nulled. Chopper-stabilizer circuit 17 is connected between nodes A, B and trim port 11. The offset voltage of op amp 10 is depicted as being a small dc voltage $V_{OS}$, between the noninverting terminal ("+") and inverting terminal ("−") of op amp 10.

In FIG. 1, the noninverting and inverting terminals of op amp 10 are electrically connected to chopper-stabilizer circuit 17 via nodes A and B, respectively. At nodes A and B, $V_{os}$ is converted to a periodic square wave by the switching action of switch 12 between nodes A and B. The square wave passes through coupling capacitor C1, and is input to amplifier 13, which amplifies the AC signal. The amplified AC signal then passes through coupling capacitor C2. An amplified DC voltage is recovered by the switching action of switch 14 across resistor R1 at nodes D and E, and by a low pass filter comprised of resistor R2 and capacitor C3. The DC voltage is then input via line 19 into trim port 11 of op amp 10 so that the offset voltage of op amp 10 is nulled.

Switches 12 and 14 are synchronized to switch repeatedly between a first state or position (e.g., nodes A and D), and a second state or position, (e.g., nodes B and E), and vice versa, with an interval of time between each of the switchings that is determined by clock 15. Clock 15 outputs a clock signal which, directly or indirectly, indicates the time at which switches 12 and 14 are to switch from their first state to their second state, or vice versa. Clock 15 may be an oscillator, for example, and the clock signal may be, or be formed from, the oscillating output voltage states of such an oscillator.

Typically, the amount of time between the switchings of the chopper switches is constant. That is, the switching frequency is constant. The switching frequency is typically a frequency far in excess of the frequency of the external signal applied to the input(s) of primary op amp 10. This approach reduces interference due to noise generated by the switches at the switching frequency. This approach is not optimal, however, because of "aliasing," which occurs when harmonics of the switching noise interfere with the desired signal.

U.S. Pat. No. 5,115,202 describes a "spreadspectrum" approach to reducing noise in a chopper-stabilized op amp. The approach uses a pseudo-random bit sequence ("PRBS") generator to pseudo-randomize the frequency of the chopper switches. In single-chip integrated circuit applications, however, this approach is not optimal. The PRBS generator creates digital noise on power supplies, which may interfere with the signal being amplified by the primary op amp as well as affecting other circuits on the chip. Moreover, the PRBS generator is only pseudo-random, not truly random like the present invention. A PRBS generator has a limited capacity for outputting random numbers and will repeat its output once that capacity is exhausted. A spectrum analysis of the output signal of a PRBS generator will yield some periodic signal. Thus, it is not truly random. Finally, the degree of randomness attained using the PRBS generator is not easily modifiable.

Accordingly, a need exists in integrated circuit applications for a clock with a true random, yet controllable, oscillation period. Use of such a true random clock in, for example, a chopper-stabilized op amp to control and randomize the amount of time between each switching of the chopper switches, would reduce the problem of interference due to aliasing of the noise created by the switching of the chopper switches. It would reduce such interference because the frequency of the switching would be random, not periodic, minimizing the generation of harmonics. Ideally, such a clock would not, in and of itself, create significant, if any, digital noise on power supplies.

SUMMARY OF THE INVENTION

In accordance with this invention, a random signal generator circuit is employed in a chopper-stabilized operational amplifier on an integrated circuit chip. The random signal generator outputs a voltage signal having a truly random voltage value within a selected range. A method for generating the truly random voltage signal is also disclosed. The random voltage signal is "truly" random in that its voltage value is unknown and unpredictable within the selected range, and repeats over time only by random chance.

In one embodiment, the truly random voltage signal is a differential voltage signal that includes random white noise voltages, such as shot noise voltages, in a selected frequency range. The random white noise voltages are generated within the components of a first differential transconductance amplifier stage of the random signal generator circuit. This first amplifier stage is cascaded with two additional such amplifiers. The first amplifier stage has no external input, and hence amplifies its own transistor shot noise or other random white random noise voltages. The amplified white noise voltages are filtered by a bandpass filter to select the frequency range of the truly random voltage signal. To prevent railing, the offset voltages of the amplifiers are nulled by feeding a voltage signal that is an integral of the output of the amplifiers back into the first amplifier.

In this embodiment, the random voltage signal generator circuit and method are used to form a random clock signal generator. The true random voltage signal that the above-mentioned random signal generator outputs is used to introduce a voltage control offset into an oscillator, such as a rail-to-rail oscillator. Normally, the signal generated by such an oscillator would have a constant frequency, that is, it would have a constant oscillation period or amount of time between oscillations and output voltage states. Inputting the true random voltage signal into such an oscillator causes the oscillation period of the oscillator to vary randomly. The amount of time between each alternating output voltage state of the oscillator, though truly random, is within a selected range of time because the value of the true random voltage signal received by the oscillator is always within a selected range of values. The alternating output voltage states of the oscillator form, or provide a basis for forming, the series of truly random clocking signals. An advantage of the embodiment of the random clock signal generator disclosed herein is that it generates little if any switching noise on DC power supplies.

As noted above, the random clock signal generator can advantageously be used in a chopper-stabilized operational amplifier. Chopper-stabilized operational amplifiers have one or more chopper switches in a chopper-stabilizer circuit which is auxiliary to a primary operational amplifier. Typically, such chopper switches repeatedly switch back and forth between two states or positions, with a constant amount of time between each switching, i.e., a constant switching frequency. Use of the truly random clocking pulse to directly or indirectly control the amount of time between each switching of one or more of the chopper switches causes the chopping period or frequency of the chopper switches also to be truly random, but within a selected range. Truly randomly varying the chopping period or frequency of the switches reduces interference seen by the primary amplifier due to aliasing of noise created at the frequency of the chopping. An advantage of the present invention is that the degree of randomness in the chopping, that is the range of the amount of variation in the chopping frequency or period is selectable, which allows one to optimize the performance of the chopper-stabilized operational amplifier.

DETAILED DESCRIPTION

Figure 2:
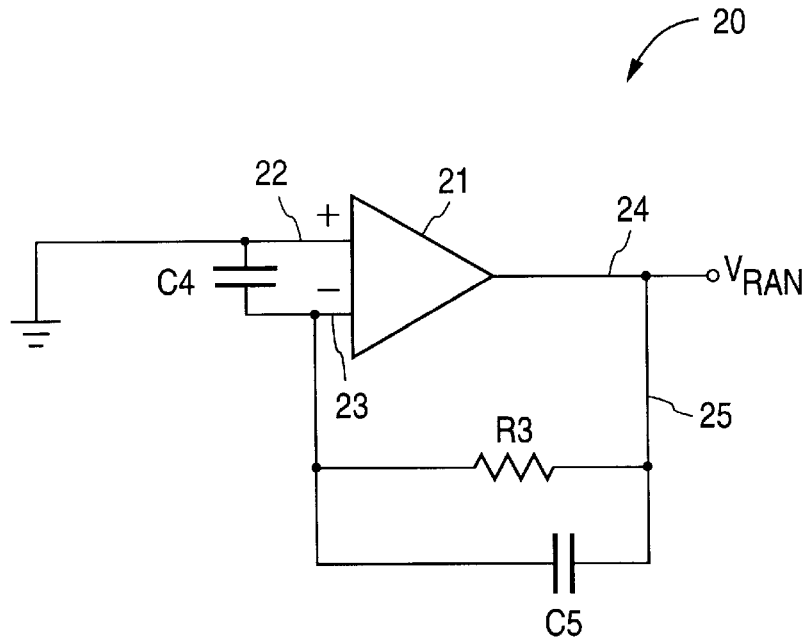
FIG. 2 is a circuit diagram of a random signal generator circuit in accordance with the invention.

FIG. 2 is a diagram of a random signal generator 20 in accordance with the present invention. It includes operational amplifier 21, which has a noninverting ("+") input terminal 22, an inverting ("−") input terminal 23, and an output terminal 24. Amplifier 21 is supplied with DC bias voltages (not shown), but has no signal input. Capacitor C4 is connected between noninverting terminal 22 and inverting terminal 21. A feedback loop 25, which includes resistor R3 connected in parallel with capacitor C5, is connected between output terminal 24 and inverting ("−") input terminal 23. Noninverting terminal 22 is grounded.

The capacitors and resistors of FIG. 2 provide a bandpass filter. The bandpass filter regulates the range of frequencies of a voltage signal $V_{RAN}$ output by random signal generator 20. Resistor R3 and capacitor C5 set the corner frequency of the low pass filter. Resistor R3 and capacitor C4 set the corner frequency of the high pass filter.

Resistor R3 and capacitor C4 also function as an integration feedback circuit. They integrate the voltage signal output on line 24 by amplifier 21, and produce an integral voltage signal reflecting that integration step. The integral voltage signal is fed back via negative feedback into inverting ("−") input terminal 23 of amplifier 21. This feedback functions to null any offset voltages of amplifier 21.

Without an input signal, and with its offset voltages nulled, amplifier 21 of random signal generator 20 amplifies random white noise voltages which are physically generated by electrical components, such as transistors or resistors within amplifier 21. These random white noise voltages are generated, for example, by the application of DC bias voltages to such components.

In one embodiment, a primary component of such random white noise voltages is shot noise voltages generated by the DC biasing of bipolar transistors in a bipolar input stage (not shown) of amplifier 21. Shot noise is a quantization error resulting from the fact that the number of electrons passing through a junction at different points in time varies. Another possible source of these random white noise voltages is thermal noise due to resistors in series with the input stage. The random white noise voltages include random voltage signals in essentially all frequencies. For a background discussion on such noise voltages, see Horowitz, P. and Hill, W., "The Art of Electronics," pp. 286–307, Cambridge Univ. Press (New York 1980).

The output of random signal generator 20 is a truly random voltage signal $V_{RAN}$ that includes amplified random white noise voltages in a selected range of frequencies. Variables affecting the RMS voltage value of $V_{RAN}$ include the amount of noise generated, the amount of amplification of the noise, and the corner frequencies of the bandpass. The amount of noise generated primarily depends on the amount of bias current selected to be passed through bipolar transistors in the input stage of amplifier 21 and the selected value of any resistors selected to be in series with the input stage. The amount of amplification of these random white noise voltages depends on the gain selected for amplifier 21. The value of the corner points of the bandpass depends on the capacitance values selected for capacitors C4 and C5 of FIG. 2.

The RMS voltage value of the voltage signal $V_{RAN}$ output by random signal generator 20 truly randomly varies within a selected range of RMS voltage values. The RMS voltage value of $V_{RAN}$ is unknown and unpredictable at any Given point in time, i.e., is truly random, but it is always within the selected range. The range of possible values of Van is selected by the selections described in the preceding paragraph.

Figure 3:
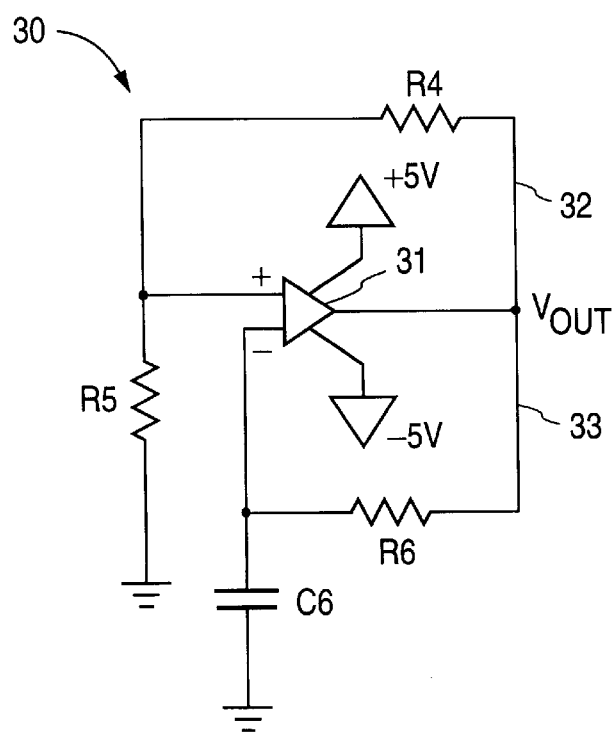
FIG. 3 is a circuit diagram of a conventional rail-to-rail oscillator circuit.

Random signal generator circuit 20 may be combined with a conventional rail-to-rail oscillator to form a random clock signal generator. FIG. 3 shows a conventional rail-to-rail oscillator. Conventional oscillator 30 includes a differential op amp 31 connected to +5 and −5 volt supplies and having an output terminal $V_{out}$. A positive feedback loop 32 consisting of equal-value resistors R4 and R5 is coupled between the non-inverting terminal ("+") and output terminal of op amp 31. A negative feedback loop 33 consisting of resistor R6 and capacitor C6 is coupled between the inverting terminal ("−") and output terminal of op amp 31.

When power is initially provided to conventional oscillator 30, the output voltage $V_{out}$ will be at either the +5 or −5 volt rail. For the discussion that follows, we will assume that $V_{out}$ is initially at the +5 volt rail. A toggle voltage of approximately 2.5 volts will appear at the non-inverting terminal ("+") of op amp 31 via positive feedback resistors R4 and R5. Current flowing through resistor R6 will charge capacitor C6 towards the toggle voltage of 2.5 volts. As the inverting terminal ("−") of op amp 31 reaches 2.5 volts, $V_{out}$ will swing low to −5 volts.

Once $V_{out}$ toggles low to −5 volts, resistors R4 and R5 will pull the non-inverting terminal ("+") of op amp 31 down to approximately −2.5 volts. Capacitor C6 will then discharge and gradually pull the inverting terminal ("−") of op amp 31 to −2.5 volts. Just as the inverting terminal voltage reaches the voltage of the noninverting terminal i.e., −2.5 volts, op amp 31 toggles and $V_{out}$ goes high to 5 volts. In this manner, $V_{out}$ oscillates rail-to-rail between 5 and −5 volts. The time between the rail-to-rail oscillations of oscillator 30 is constant, i.e., its period and frequency is constant:, and is set by selection of the RC time constant of the negative feedback loop (i.e., the values of resistor R6 and capacitor C6).

Figure 1:
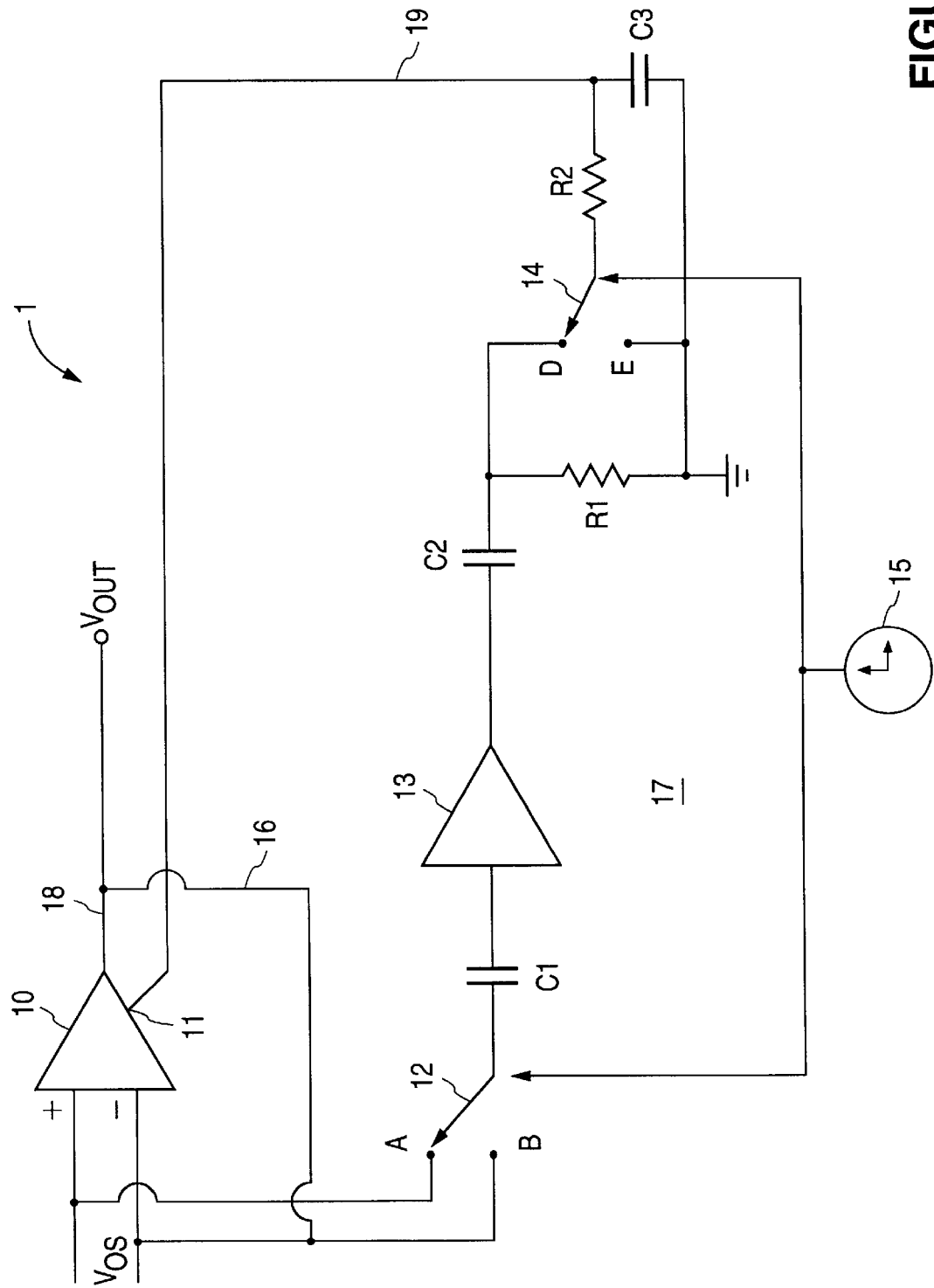
FIG. 1 is a circuit diagram of a conventional chopper-stabilized operational amplifier.

The oscillating rail-to-rail voltage outputs of oscillator 30 of FIG. 3 may be used directly or indirectly to form a series of clock signals or pulses to directly or indirectly regulate the amount of time between each of the successive switchings of the switches in a chopper-stabilized operational amplifier, such as that shown in FIG. 1. In accordance with one embodiment the present invention, the frequency or amount of time between the alternating rail-to-rail output voltage states of such an oscillator may be made to truly randomly vary by inputting the truly random voltage signal $V_{RAN}$ output by random signal generator 20 into oscillator 30.

Figure 4:
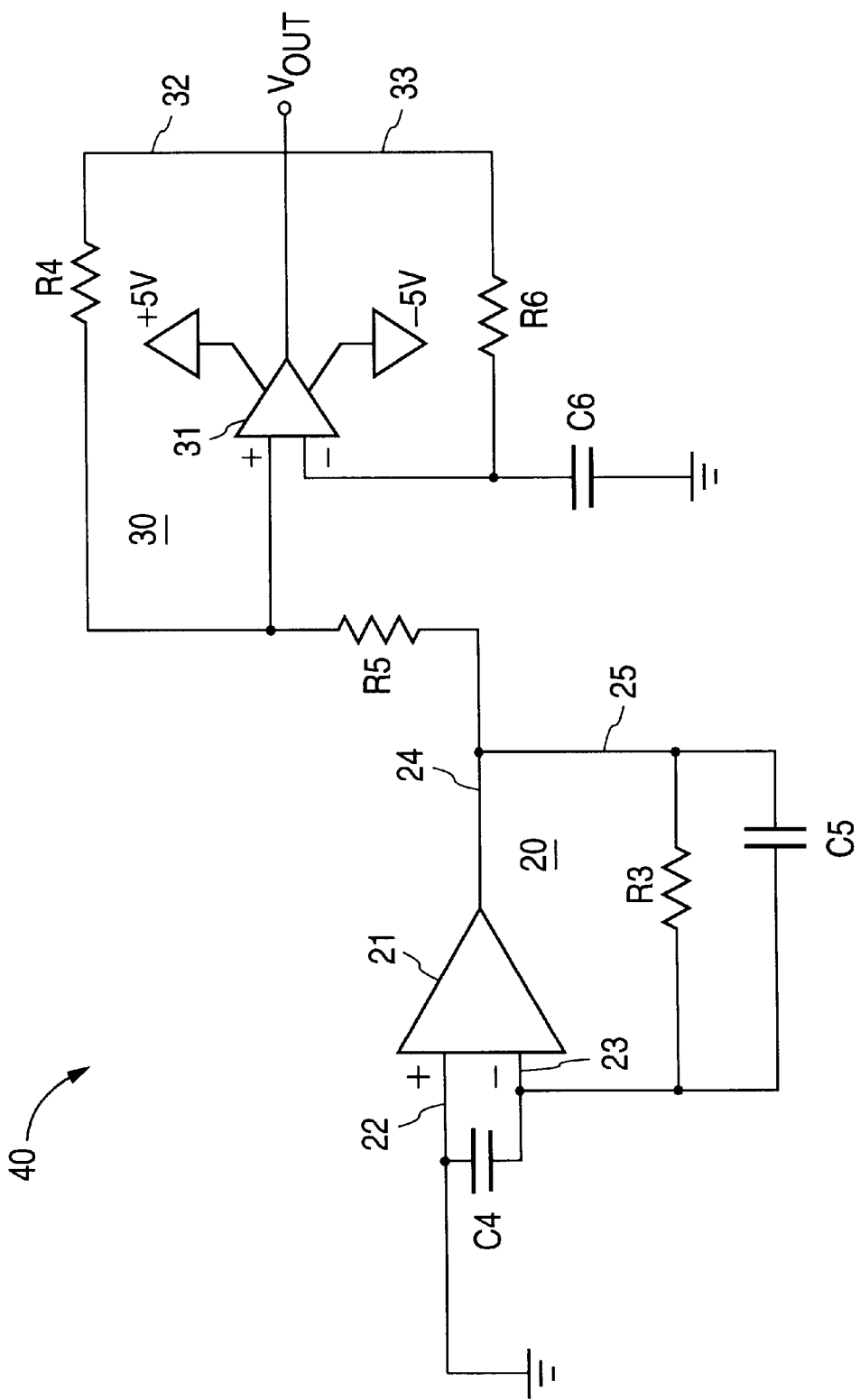
FIG. 4 is a circuit diagram of a random clock signal generator in accordance with the invention, including a random signal generator and a conventional rail-to-rail oscillator.

FIG. 4 shows a random clock signal generator 40, formed of the random signal generator 20 of FIG. 2 and the conventional rail-to-rail oscillator 30 of FIG. 3. (Components of FIGS. 2 and 3 which also appear in FIG. 4 are identified by the same numbers.) As described above with respect to FIG. 2, random signal generator 20 outputs a truly randomly varying voltage signal $V_{RAN}$, whose voltage value truly randomly varies within a selected range. In FIG. 4, output 24 is connected to resistor R5, which in turn is connected to the noninverting terminal ("+") of op amp 31. Inputting the true random voltage signal $V_{RAN}$ into the noninverting terminal ("+") of op amp 31 via resistor R5 truly randomly changes the toggle voltage of oscillator 30. Accordingly, the amount of time necessary for capacitor C6 to reach the toggle voltage also varies truly randomly. Hence, the amount of time between each of the successive rail to rail oscillations of oscillator 30, and thus between each change of state of the clocking signal $V_{out}$ output by random signal generator 40, will vary in a truly random manner within a selected range of time. In other words, the rail-to-rail voltage signal $V_{out}$ output by random clock signal generator 40 appears to be truly randomly phase modulated, albeit in a controlled range.

Although the exact transition time between each successive output voltage rail or state of random clock signal generator 40 is unknown and unpredictable, the range of the clock signal periods and the average clock signal period will be known. The range of periods and the average period are selected by the choice of the range of possible values for the true random voltage signal $V_{RAN}$, as is described above, and of the underlying oscillation period of oscillator 30, which is also described above.

Figure 5:
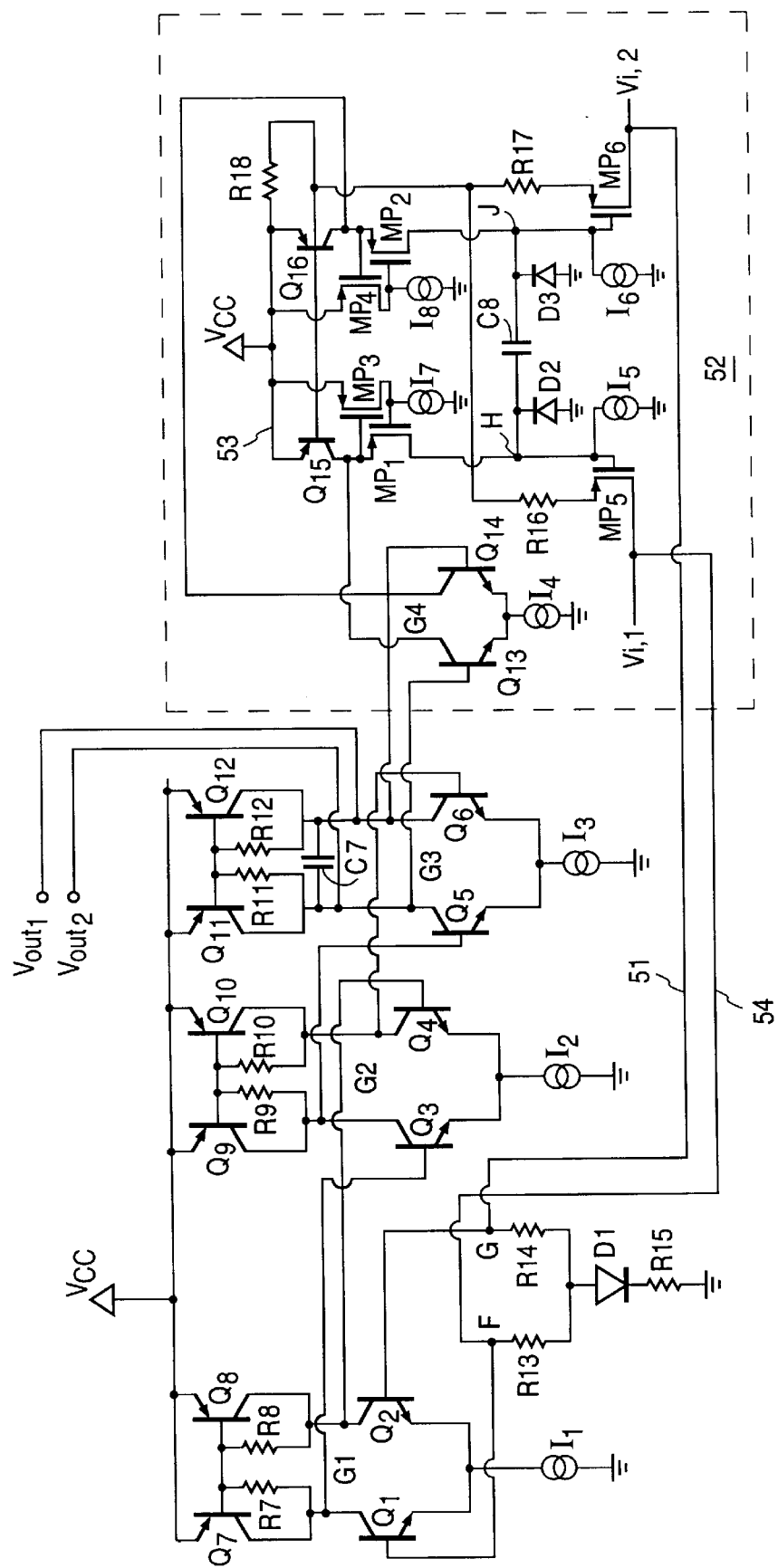
FIG. 5 is an alternative circuit diagram of a random signal generator in accordance with the invention.

FIG. 5 shows an alternative random signal generator 50 in accordance with the present invention, which may be formed on a single integrated circuit chip using a BICMOS fabrication process. It may, for example, be formed on the same chip as a differential oscillator to form a random clock signal generator, and/or on the same chip as a chopper-stabilized operational amplifier whose switch closings are controlled by a series of clocking pulses output by the random clock signal generator.

Random signal generator 50 outputs a random differential voltage signal, $V_{out,1}-V_{out,2}$, whose RMS voltage value at any point in time is truly random, i.e., unknown and unpredictable and repeating only by random chance, but is always within a selected range.

Random signal generator 50 includes three cascaded differential transconductance amplifier circuits or gain stages, which are denoted: G1, G2, and G3.

Amplifier G1 is a first or input stage, and includes a pair of bipolar npn transistors Q1 and Q2. As is discussed below, the bases of transistors Q1 and Q2 receive as an input via nodes F and G a differential voltage signal reflecting the integral of the differential voltage output of the final noise amplifier stage, which in this embodiment is the G3 stage. The differential output voltage of the G1 stage is taken across the collectors of transistors Q1 and Q2.

Amplifier stage G2 is a second amplification stage, and includes a pair of bipolar npn transistors Q3 and Q4. Amplifier stage G3 is a third amplification stage, and includes a pair of bipolar npn transistors Q5 and Q6. The bases of transistors Q3 and Q4 of the G2 stage receive as a differential input the differential voltage output by the G1 stage. The G2 stage outputs an amplified differential voltage signal reflecting its input. The output of the G2 stage is taken across the collectors of transistors Q3 and Q4. The bases of transistors Q5 and Q6 of the G3 stage receive as a differential input the differential voltage output by the G2 stage. At the collectors of transistors Q5 and Q6, the G3 stage outputs an amplified differential voltage signal reflecting the input to the G3 stage. The true random differential voltage signal ($V_{out}$–$V_{out,2}$) output by random signal generator 50 is taken across the collectors of transistors Q5 and Q6 of the G3 stage.

Returning to the G1 stage, pnp transistors Q7 and Q8, in combination with resistors R7 and R8, source a DC bias current to the collectors of transistors Q1 and Q2. Resistors R7 and R8 are connected across the base/collector junctions of transistors Q7 and Q8, respectively. This arrangement is suited for low voltage operation, since transistors Q7 and Q8 function to ensure that the average DC bias voltage at the collectors of Q1 and Q2 is constant at one diode drop below the DC bias supply voltage.

The G2 stage and the G3 stage have identical source current arrangements at the collectors of their respective transistor pairs. Bias current for the G2 stage is sourced by pnp transistors Q9 and Q10 and resistors R9 and Rio, and bias current for the G3 stage is sourced by pnp transistors Q11 and Q12 and resistors R11 and R12.

Current sources $I_1$, $I_2$, and $I_3$ bias the G1, G2, and G3 stages. Each of these current sources is generated by a band gap generator, which ensures that the G1, G2, and G3 stages have a constant gain over process and temperature. The amount of gain of the G1, G2, and G3 stages is selected by the amount of current sourced by $I_1$ $I_2$ and $I_3$, respectively.

Capacitor C7 across the collectors of transistors Q5 and Q6 of the G3 stage forms part of the bandpass filter of random signal generator 50. As an example, a capacitor having a value of approximately one pico-Farad may be used.

The embodiment of FIG. 5 includes a differential feedback loop which includes an integrator 52 and conductive lines 51 and 54. Integrator 52 is shown within the dashed box in FIG. 5. The true random differential voltage signal output at the collectors of transistors Q5 and Q6 of the G3 stage is input to integrator 52 at the bases of transistors Q13 and Q14 of the G4 stage and is integrated by integrator 52.

Integrator 52 of FIG. 5 includes a differential transconductance amplifier stage, denoted G4, and a floating capacitor circuit 53. The G4 stage includes a pair of bipolar npn transistors Q13 and Q14. G4 is biased by current source $I_4$. which is a band gap generated current source. The G4 stage has a very low gain and functions like a very large resistor.

The bases of transistors Q13 and Q14 are connected to the collectors of transistors Q5 and Q6 of the G3 stage, and thus receive as an input the true random differential voltage signal output by the G3 stage. The collectors of transistors Q13 and Q14 of the G4 stage are connected to the collectors of pnp transistors Q15 and Q16, respectively, of floating capacitor circuit 53. The cooperation and functioning of the G4 stage and floating capacitor circuit 53 of integrator 52 to produce a differential voltage signal ($V_{i,1}$–$V_{i,2}$) reflective of the integral of the output of the G3 stage is addressed below.

The differential integral voltage signal ($V_{i,1}$–$V_{i,2}$) output by integrator 52 at the drains of P channel transistors MP5 and MP6 is fed as a sole input back into the bases of transistors Q1 and Q2 of the G1 stage via lines 51 and 54 and nodes F and G. The base of transistor Q1 is electrically connected to node F, and the base of transistor Q2 is electrically connected to node G. Nodes F and G are also connected to ground through resistors R13 and R14, respectively, diode D1, and resistor R15. Example values of resistors R13 and R14 are 1 k-ohm.

Feeding the differential integral of the G3 output back into the G1 stage, specifically to the bases of transistors Q1 and Q2, practically nulls the offsets of the G1, G2, and G3 stages. This prevents railing of the output of random signal generator 50 due to the undesired, but largely unavoidable, offset voltages of the amplifier stages.

With the offset voltages of the G1, G2, and G3 amplifier stages nulled in such a manner, and without any other input to the bases of transistors Q1 and Q2 other than from nodes F and G, the G1 stage amplifies and outputs truly random white noise voltages that inherently result from the application of current to circuit components. In the embodiment of FIG. 5, these random white noise voltages include shot noise voltages generated by the application of DC bias current to transistors Q1 and Q2 of the G1 stage, together with any thermal noise voltages of resistors R13 and R14. The amount of noise so generated is selected by the amount of bias current and the value of resistors R13 and R14. Other on-chip sources of random white noise voltages could be tapped in alternative embodiments.

The truly random white noise voltage signals amplified and output by the G1. amplifier are subsequently amplified by the G2 and G3 stages. Components within the G2 and G3 stages also generate such random white noise voltages, but their random white noise voltages are drowned within the amplified output of the G1 stage.

Random signal generator 50 also includes a bandpass filter, which sets the frequency range or bandwidth of the differential voltage signal ($V_{out,1}$–$V_{out,2}$) that random signal generator 50 outputs.

As discussed above, G1 amplifies its own random white noise voltages, which essentially includes all frequencies, and the G2 and G3 stages successively amplify the differential voltages output by the G1 stage. The bandpass filter filters out all but a selected frequency range of these random white noise voltages. In other words, the random white noise voltage signal output by random signal generator 50 reflects only a selected range of the white noise frequencies originally output by the G1 stage. The high frequency corner point of the bandpass is set by resistors R11 and R12 working into capacitor C7, and is selected by the resistance or capacitance values chosen for those components. The low frequency corner point of the bandpass is set by the effective impedance of transistors Q13 and Q14 of the G4 stage working into capacitor C8, and is selected by the effective impedance or capacitance values chosen for those components.

The ultimate output of random signal generator 50, taken at the collectors of transistors Q5 and Q6 of the G3 stage after the above-described steps of noise voltage generation, amplification, band pass filtering, and integration feedback, is a true random differential voltage signal ($V_{out,1}$–$V_{out,2}$) comprised of selectively amplified random white noise voltages in a selected range of frequencies. $V_{out,1}$–$V_{out,2}$ is a truly random voltage signal because it is comprised of amplified truly random white noise voltages (e.g., shot noise voltages) in a selected range of frequencies. The RMS voltage value of this differential output voltage signal truly randomly varies within a selected range. It is unknown, unpredictable, and repeats over time only by random chance.

The RMS voltage value of differential voltage signal $V_{out,1}$–$V_{out,2}$ is always within a selected range. In other words, the degree of randomness is controlled. The range of RMS voltage values of this random differential voltage signal is selected by the choice of components and/or voltage or current values within random signal generator 50, as discussed above.

Example design choices for random signal generator 50 of FIG. 5 include: a collector current through each of transistors Q1, Q2, Q3, Q4, Q5, and Q6 of approximately 3 micro-amps; resistance values for resistors R7, R8, R9, and R10 of approximately 100 k-ohms, and for resistors R11 and R12 of approximately 200 k-ohms; a capacitance value for capacitor C7 of approximately 1 pico-Farad, and for capacitor C8 of approximately 6 pico-Farads; and, a collector current through each of transistors Q13 and Q14 of approximately 183 pico-amps. An example average value for $V_{out,1}-V_{out,2}$ is 10 milli-volts RMS, and an example range of possible values for $V_{out,1}-V_{out,2}$ is between about 5 and 20 milli-volts RMS.

Integrator 52, i.e., the G4 stage and floating capacitor circuit 53, is in accordance with the circuit shown in FIG. 2 of U.S. patent application Ser. No. 08/527,401, entitled "Floating Capacitor Differential Integrator," now U.S. Pat. No. 5,793,242, which application is incorporated herein by reference. The reader should refer to that application for a detailed description of integrator 52.

Referring to integrator 52 of FIG. 5 of the present application, the collectors of transistors Q13 and Q14 of the G4 stage are connected to the collectors of pnp transistors Q15 and Q16, respectively, of floating capacitor circuit 53. Transistors Q13 and Q14 sink current from transistors Q15 and Q16, respectively, responsive to the differential voltage applied to the bases of transistors Q13 and Q14. Transistors Q15 and Q16 provide nodes H and J, respectively, with a common mode current via P-channel pass transistors MP1 and MP2, respectively. Current sources $I_5$ and $I_6$ supply pass transistors MP1 and MP2, respectively. Current sources $I_7$ and $I_8$, supply P-channel transistors MP3 and MP4, respectively. MP3 and MP4 control the conductive states of transistors MP1 and MP2, respectively. P-channel transistors MP5 and MP6, along with resistors R16 and R17, form a common mode feedback loop. The drains of transistors MP5 and MP6 are connected to nodes F and G, respectively, as discussed above. Resistor R18 sources current to transistors MP5 and MP6 via resistors R16 and R17, respectively. An integrating capacitor C8 is connected between nodes H and J. Capacitor C8 is fabricated so as to have equal parasitic leakages on each of its plates, as modeled by diodes D2 and D3. Capacitor C8 may be replaced by two capacitors connected in parallel.

Integrator 52 is fully differential. It responds only to differential currents and voltages, and ignores common mode currents and voltages. Its symmetrical design allows it to balance increases in voltages on one side of the circuit, e, the side of node H, with equal decreases in voltages and/or currents on the other side of the circuit, e.g. the side of node J. Since the common mode or average voltage of nodes H and J remains constant, capacitor C8 "floats" at a constant voltage.

Referring again to FIG. 5 of the present application, when the differential voltage output by the G3 stage is input to the G4 stage, i.e., input to the bases of transistors Q13 and Q14, integrator 52 produces a differential voltage output signal $(V_{i,1}-V_{i,2})$, which appears across the drains of transistors MP5 and MP6. This differential integral voltage signal is provided via lines 51 and 54 to nodes F and G, and in turn to the bases of transistors Q1 and Q2 of the G1 stage.

Integrator 52 achieves a relatively high RC time constant, while minimizing the size of capacitor C8, because integrator 52 maintains the collector voltages of transistors Q15 and Q16 at a substantially constant value. Since the collector voltages of transistors Q15 and Q16 are insensitive to changes in the respective drain voltages of transistors MP1 and MP2, the collectors of transistors Q15 and Q16 are buffered to act as nearly ideal current sources. That is, the drains of transistors MP1 and MP2 exhibit impedances approaching infinite. It follows, then, that the effective impedance across capacitor C8, as seen looking in from nodes H and J, approaches infinite. The above described structure realizes impedances across capacitor C8 on the order of terra-ohms or higher.

The arrangement of random signal generator 50 may be varied. For example, the number of differential transconductance amplifier stages may be one, two, three (as shown), or more than three. As another example, the design of integrator 52 may be changed. A conventional resistor and capacitor may be used as an integrator circuit.

Figure 6:
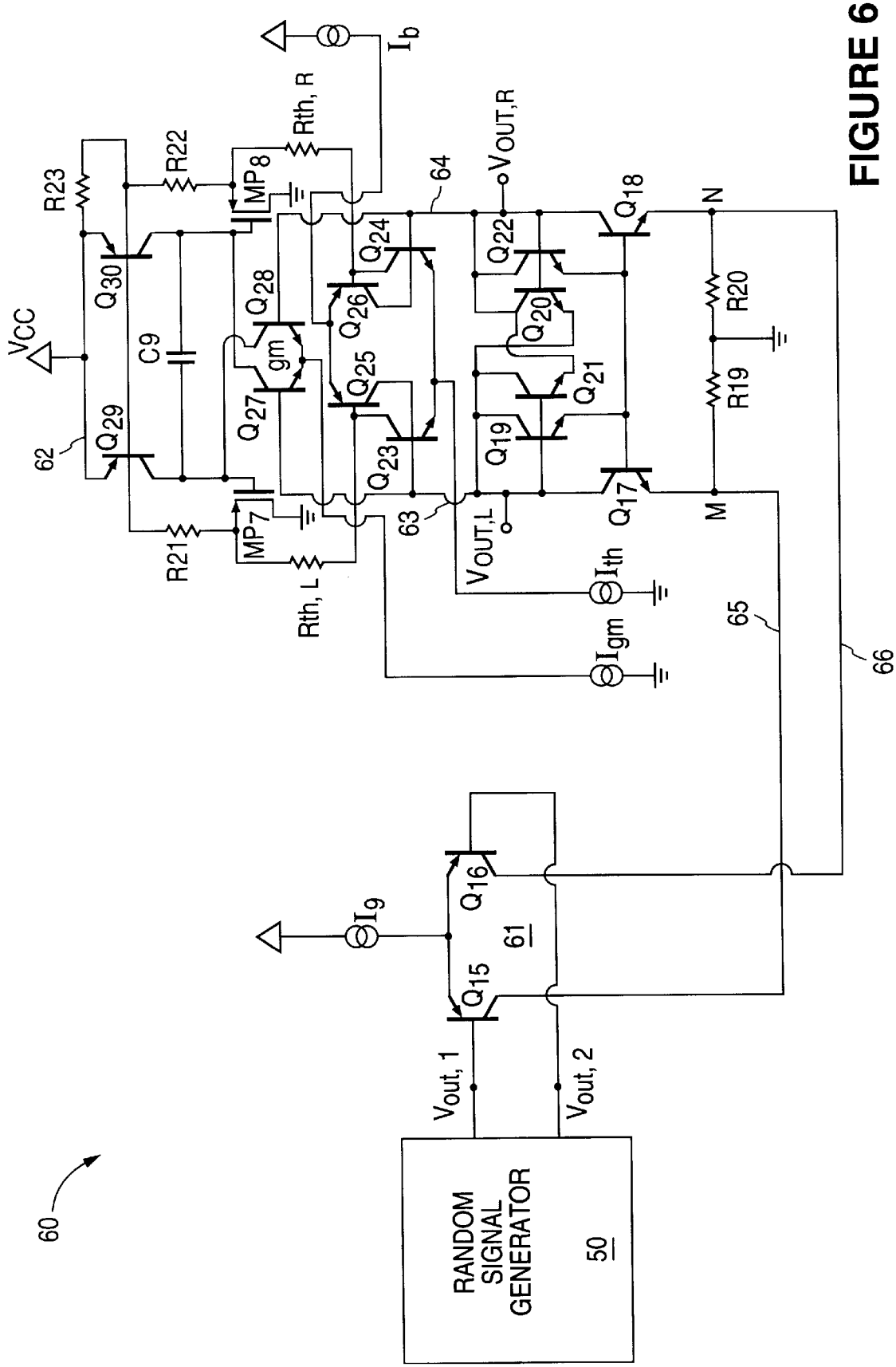
FIG. 6 is a circuit diagram of random clock signal generator in accordance with the invention, including the alternative random signal generator and an alternative oscillator.

FIG. 6 of the present application shows a random clock signal generator 60 comprised of a random signal generator block 50, an interface circuit including a differential amplifier stage 61, and a differential oscillator 62. The random signal generator block 50 of FIG. 6 represents the circuit of random signal generator 50 of FIG. 5 of the present application. Random signal generator 50 outputs a true random differential voltage signal $V_{OUT,1}-V_{OUT,2}$, which includes amplified random white noise voltages in a selected range of frequencies.

Returning to FIG. 6, between random signal generator 50 and oscillator 62 is an interface circuit, comprised of differential amplifier stage 61, which includes pnp transistors Q15 and Q16. Current source I9 provides bias current for transistors Q15 and Q16. I9 is a band-gap generated current source. An example collector current for each of transistors Q15 and Q16 is 2.1 micro-amps.

The bases of transistors Q15 and Q16 receive the true random differential voltage signal $V_{OUT,1}-V_{OUT,2}$ output by random signal generator 50. The collectors of transistors Q15 and Q16 are connected via lines 65 and 66 to the emitters of transistors Q17 and Q18, at nodes M and N, respectively. Identical degeneration resistors R19 and R20 are connected between nodes M and N, respectively, and ground. An example value for each of resistors R19 and R20 is 100 k-ohms. An example average voltage drop across each of resistors R19 and R20 is approximately 200 milli-volts.

Differential amplifier 61 effects a DC level shift between random signal generator 50, whose output has a DC component of about one volt, and differential oscillator 62. The emitter currents of transistors Q17 and Q18 of oscillator 62 have a DC component of approximately zero.

Oscillator 62 of FIG. 6 is the same design as the oscillator shown in FIG. 2 of U.S. Pat. No. 5,600,283, which application is incorporated herein by reference, except for degeneration resistors R19 and R20. Resistors R19 and R20 are identically sized, and are connected between the collectors of transistors Q17 and Q18, respectively, and ground. The reader should refer to incorporated U.S. Pat. No. 5,600,283 for a detailed description of oscillator 62.

Within oscillator 62, NPN transistors Q17, Q18, Q19, Q20, Q21, and Q22 form a gain stage which is connected between the right and left output terminals, $V_{OUT,R}$ and $V_{OUT,L}$, respectively, of oscillator 62. NPN transistors Q23 and Q24, together with resistors $R_{TH,L}$ and $R_{TH,R}$, provide a differential positive feedback. PNP transistors Q25 and Q26 form a differential comparator, while capacitor C9 and a differential transconductance amplifier or "gm" stage formed by NPN transistors Q27 and Q28 provide a differential negative feedback. The gm stage is driven by current source $I_{gm}$ which, in turn, determines the slew rate of capacitor C9. Current source $I_{TH}$ and resistors $R_{TH,R}$ and $R_{TH,L}$ determine the toggle voltage of capacitor C9, while resistors R21 and R22 determine the common mode, or average, voltage of capacitor C9. P-channel pass transistors MP7 and MP8 buffer capacitor C9. Current source $I_b$ biases transistors Q25 and Q26. PNP transistors Q29 and Q30, along with biasing resistor R23, form two equal current sources to provide current to both nodes of capacitor C9. Oscillator 62 provides a differential output voltage at output terminals $V_{OUT,R}$ and $V_{OUT,L}$.

The output voltages at output terminals $V_{OUT,R}$ and $V_{OUT,L}$ are alternatively in high and low states. There is an amount of time between each output state. In a first state, $V_{OUT,R}$ is high and $V_{OUT,L}$ is low. In a second state, $V_{OUT,R}$ is low and $V_{OUT,L}$ is high. When $V_{OUT,R}$ is high, its voltage value is approximately two diode drops above ground ($V_{be}$ of transistor Q18+$V_{be}$ of Q22) and $V_{OUT,L}$ is only one diode drop above ground (i.e., $V_{OUT,R}$-$V_{be}$ of Q20). When $V_{OUT,L}$ is high, its voltage value is approximately two diode drops above ground ($V_{be}$ of Q17+$V_{be}$ of Q19), and $V_{OUT,R}$ is only one diode drop above ground (i.e., $V_{OUT,L}$-$V_{be}$ of Q21).

Assume for a moment that there is no connection between amplifier 61 and oscillator 62 and no resistors R19 and R20. As described in incorporated U.S. Pat. No. 5,600,283, oscillator 62 normally oscillates between its output states when the base voltages of transistors Q25 and Q26, which form a comparator, are approximately equal. There are two inputs to the comparator formed by transistors Q25 and Q26, which cause oscillator 62 to toggle. First, there is a positive feedback through transistors Q23 and Q24 working into resistors $R_{TH,L}$ and $R_{TH,R}$. Second, there is a negative feedback through transistors Q27 and Q28 working into capacitor C9, which is buffered by channel devices MP7 and MP8. The collector currents of transistors Q17 and Q18 are equal, and the amount of time between the alternating output states of oscillator 62 is always the same amount of time, i.e., the oscillation period and frequency are constant. The oscillator's period and frequency are selected by component choices, as is described in incorporated U.S. Pat. No. 5,600,283.

In the embodiment of FIG. 6 of the present application, a voltage controlled offset is introduced into oscillator 62 at nodes M and N. Recall that random signal generator 50 of outputs a true random differential voltage signal having a truly random RMS voltage value within a selected range. The introduction of this truly random varying differential voltage signal from random signal generator 50 via amplifier 61 into oscillator 62 at nodes M and N upsets the matching that would otherwise exist between the collector currents of transistors Q17 and Q18. The collector currents of transistors Q17 and Q18 will truly randomly vary because of the truly randomly varying voltage drops across resistors R19 and R20. This in turn affects the base voltage toggling of transistors Q25 and Q26. It is as if a truly randomly varying voltage source is placed in series with the inputs of the comparator formed by transistors Q25 and Q26. Accordingly, the amount of time it takes until the base voltages of transistors Q25 and Q26 become equal, causing oscillator 62 to toggle between its output states, will also truly randomly vary. Hence, the amount of time between successive oscillations of oscillator 62 and between its alternating output voltage states will truly randomly vary within a selected range of time on either side of the average oscillation period of oscillator 62, and the amount of time between each oscillation will repeat only by random chance. The amount of time variation between each oscillation and alternating output state is within a controlled range of time, for example, +/-100 microseconds around the average period, because the RMS voltage value of the true random voltage signal output by random signal generator 50 is always within a selected range.

The range of time variation in the oscillation periods may be adjusted by changing the true random voltage signal $V_{out,1}$-$V_{out,2}$ output by random signal generator 50. For example, the amount amplification of the random white noise voltages or the range of frequencies passed by the bandpass filter of random signal generator 50 may be changed.

As an example, random clock signal generator 60 may have an average oscillation period of 250 microseconds, with a truly random variation about the average in a range of plus or minus approximately 100 micro-seconds. In other words, the oscillator period truly randomly varies within a range of time of between 150 and 350 microseconds.

The oscillating first and second voltage output states of random clock signal generator 60 may be used, directly or indirectly, to form a series of clocking pulses to regulate the timing of successive switchings of the chopper switches in a chopper-stabilized operational amplifier, among other applications. Using a random clock signal generator circuit having such a random oscillation period avoids or reduces the problem of noise caused by a periodic switching of the chopper switches. It also avoids the DC noise that would be created by the use of a PRBS generator, because random clock signal generator 60, including random signal generator 50 and oscillator 62, draws only low, constant DC currents, for example, 16 micro-amps. Moreover, unlike the pseudo-random clocking pulses obtainable using a PRBS generator, the amount of time between each of the oscillating first and second output voltage states of random clock signal generator 60 is truly random and repeats only by random chance. The degree of randomness is also selectable, as described above.

Figure 7:
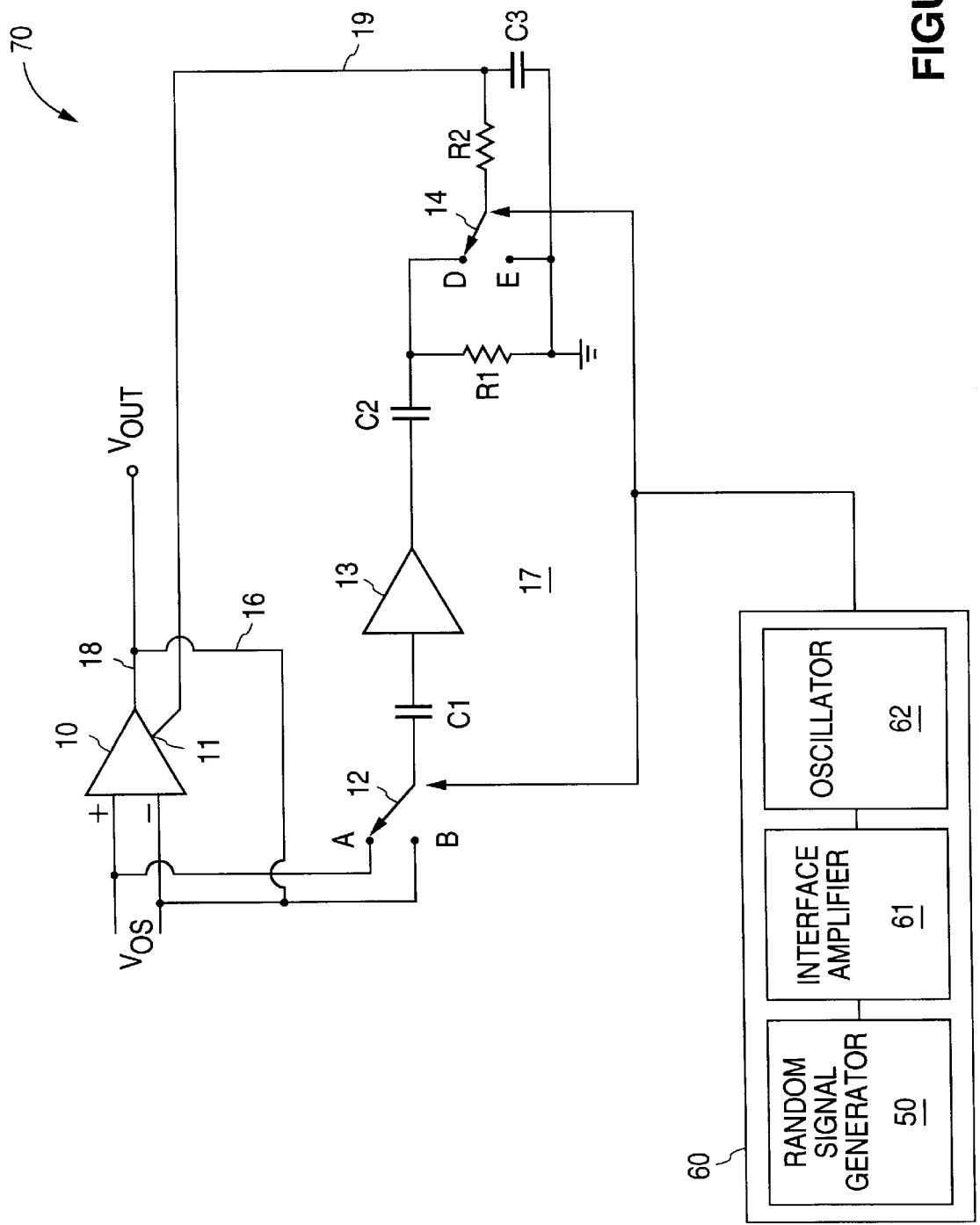
FIG. 7 is a circuit diagram of a chopper-stabilized operational amplifier having a random clock signal generator.

FIG. 7 shows an embodiment of a chopper-stabilized operational amplifier 70 in accordance with the present invention. FIG. 7 includes the chopper-stabilized amplifier of FIG. 1, except that clock 15 of FIG. 1 is replaced by a random clock signal generator 60. The switches of chopper-stabilized operational amplifier 70 may be low noise chopper switches, such as are described in above-referenced application Ser. No. 08/811,063 now U.S Pat. No. 5,959,498.

Random clock signal generator 60 of FIG. 7 includes a random signal generator 50, an interface amplifier 61, and an oscillator 50, which represent the analogous circuits of FIGS. 5 and 6. The random signal generator 50 of FIG. 7 outputs a true random differential voltage signal including amplified random white noise voltages in a selected range of frequencies. The instantaneous RMS voltage value of this signal is truly random, and repeats only by random chance. It is, however, always within a selected range.

Oscillator 62 of FIG. 7 oscillates between and outputs a first output voltage state and a second output voltage state. The time intervals separating each of the transitions back and forth between the first and second output voltage states are truly random in duration, but lie within a selected range of times. These alternating output voltage states may be used, directly or indirectly, as a clocking pulse to signal the times at which the chopper switch or switches of FIG. 7 should switch between states or positions.

Figure 8:
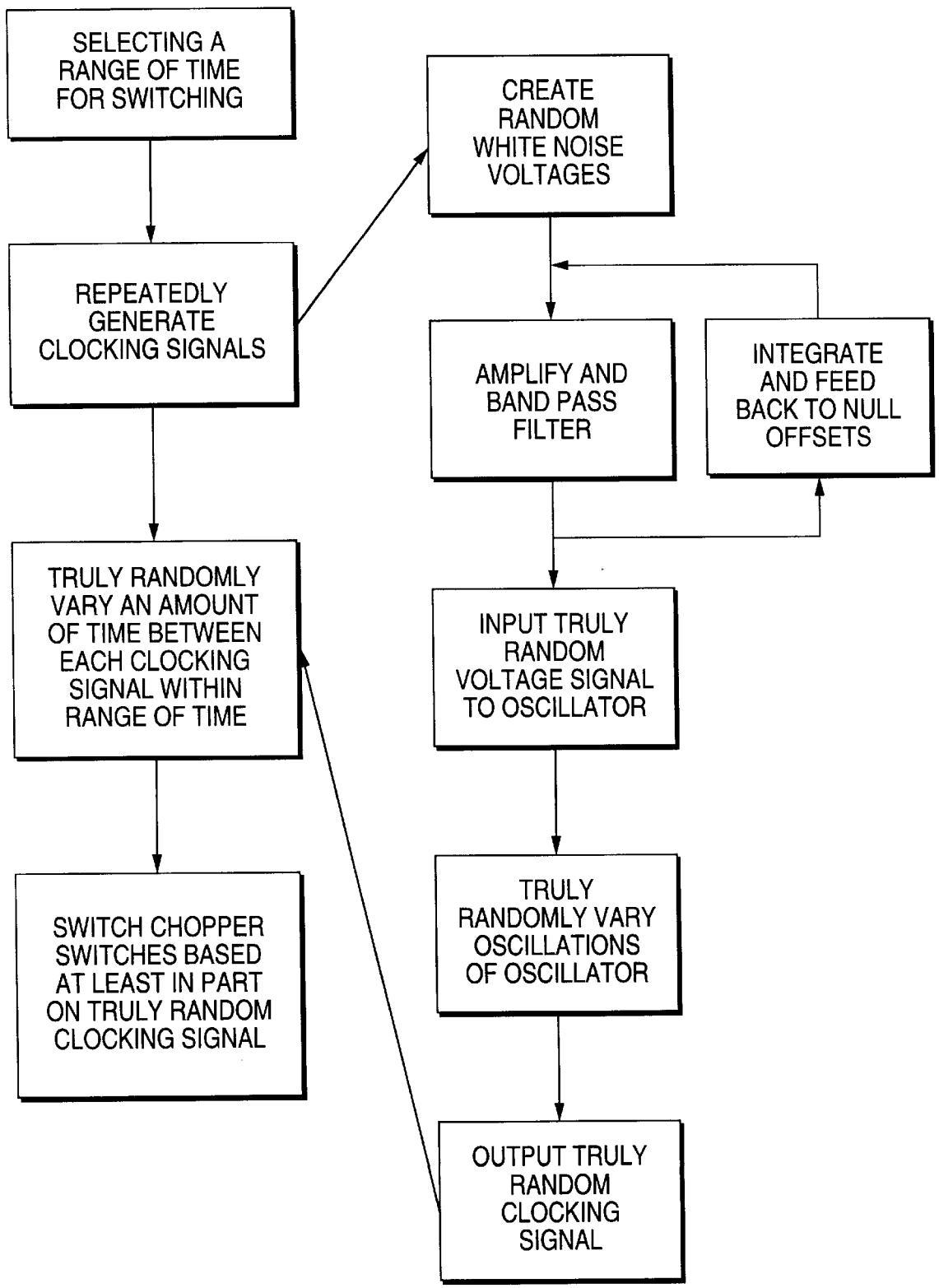
FIG. 8 is a flow chart of steps in a method of controlling the amount of time between switchings of a chopper switch in a chopper-stabilized operational amplifier.

In another aspect, the present invention includes methods of controlling the amount of time between each switching of one or more switches in a chopper-stabilized operational amplifier. FIG. 8 is a flow chart of one embodiment such methods. A first step includes selecting a range of time within which the switch (or switches in an alternative embodiment) should switch back and forth between a first state or position and a second state or position. For example, in an embodiment such as in FIG. 7, the first state of switch 12 is node A, and the second state of switch 12 is node B. The amount of time between a switching from the first state to the second state, or vice versa, may be, for example, anywhere between 150 microseconds and 350 microseconds, with an average time between each switching of 250 micro-seconds. A second step is to repeatedly generate a clocking signal to indicate, directly or indirectly, when the switch should switch between states.

In accordance with the present invention, a third step is to truly randomly vary, within the selected range of time, the amount of time between each clocking signal, and hence between each successive switching of the chopper switch.

In greater detail, the above method may include steps of creating random white noise voltages, such as shot noise voltages, on the same integrated circuit chip on which the chopper-stabilized operational amplifier is implemented. For example, shot noise voltages may be generated by DC biasing the bipolar transistors in a differential transconductance amplifier, such as bipolar transistors Q1 and Q2 in the G1 stage of FIG. 5 of the present application. The amount of shot noise voltages so generated may be controlled by selecting the amount of bias current. Steps of amplifying and bandpass filtering these random white noise voltages are then performed. The amount of amplification may be selected by choosing an amplifier having an appropriate gain. The bandpass filtering step, which may be performed with an RC network or equivalent, ensures that a selected frequency range of the random white noise voltages is passed. Random white noise voltages at frequencies outside the selected frequency range are filtered out. The net result is a true random voltage signal, which may be a differential voltage signal, comprised of amplified random white noise voltages in a selected range of frequencies. This voltage signal, which will be referred to as a true random voltage signal, has a RMS voltage value which has a truly random value within a selected range at any point in time. The RMS voltage value of this signal repeats over time only by random chance. An example average value of this true random voltage signal, which may be generated by employing random signal generator 50 of FIG. 5, is about 10 milli-volts RMS, and truly randomly ranges in value from about 5 to 20 milli-volts RMS.

The true random voltage signal so generated may be input, in a next step, to an oscillator to form a series of true random clocking signals or pulses to directly or indirectly control when the chopper switches should successively switch from one state to the other state. The oscillator provided should be capable of oscillating between and outputting a first output voltage state and a second output voltage state, with the alternating output voltage states serving as the clocking signals. As an example, oscillator 30 of FIG. 3 or oscillator 62 of FIG. 6 may be provided.

A next step is to truly randomly vary the amount of time between each successive oscillation and output voltage state of the oscillator so that the amount of time truly randomly varies within a selected range of time. A circuit such as the random clock signal generators of FIGS. 4 and 6 may be employed to implement this method. Referring to FIG. 4, oscillator 30 has, in a case where no input signal is provided from random signal generator 20, a constant standard oscillation period which is selected by the RC time constant of the negative feedback loop of oscillator 30. Inputting a truly randomly varying voltage signal from random signal generator 20 into oscillator 30 at resistor R5 causes the amount of time between oscillations of oscillator 30 to truly randomly vary, within a range of time, which range reflects the range of possible values of the true random voltage signal. The range of possible values of the true random voltage signal is established by the previously mentioned steps of noise voltage creation, amplification, and bandpass filtering. The true random clocking signal is formed, directly or indirectly, from the alternating output voltage states output by the oscillator.

In an embodiment such as is shown in FIG. 5, there are additional steps of providing three cascaded differential transconductance amplifiers on the same integrated circuit chip as the chopper-stabilized operational amplifier. Steps of creating random white noise (e.g., shot noise) voltages within a first amplifier stage, and then amplifying and band pass filtering such noise voltages are then performed, so that a true randomly varying differential voltage signal is formed which has a truly random RMS voltage value within a selected range of RMS voltage values. This signal may then be input into an oscillator, as described above, to form and output a series of clocking signals, each of which has a truly random period within a selected range of periods.

An additional step of nulling the offsets of the amplifier stages may be undertaken to prevent railing of the amplifier outputs. For example, in the embodiment of FIG. 5, this nulling step is performed by feeding an integral of the output voltage of amplifiers G1–G3 back into the first amplifier stage, specifically to the bases of transistors Q1 and Q2 of the G1 stage.

The above described embodiments of the present invention have numerous advantages. For example, as described above, the random signal generator circuits of FIGS. 2 and 5, and the random clock signal generator circuits of FIGS. 4, 6, and 7 are implemented on a single integrated circuit chip. As is also described above, chopper stabilized operational amplifier 70 of FIG. 7, which includes random signal generator 50 and random clock signal generator 60, is implemented on a single integrated circuit chip.

Another advantage of random signal generator 50 of FIG. 5 and random clock signal generator 60 of FIG. 6 is that these circuits do not generate digital noise, e.g., current spikes, on the power supply that supplies those circuits. No digital noise is generated because, for each and every current or voltage that turns on in both random noise generator 50 and random clock signal generator 60, an equal current or voltage turns off. This is a result of the balanced, symmetrical design of random noise generator 50 and random clock signal generator 60, as shown in from FIGS. 5 and 6. The circuits are differential, not common mode. The symmetrical design of random noise generator 50 and random clock signal generator 60 not only avoids digital noise, but also rejects noise generated elsewhere on the chip.

In an application where the single integrated circuit chip includes both digital and analog circuitry, the present invention eliminates cross talk between the digital and analog circuitry. One practical benefit is that the chip does not need separate power inputs for the digital and analog circuitry.

The same power supply and lines may be used for the analog and digital circuits without fear of cross talk.

By contrast, the chopper stabilized operational amplifier shown in U.S. Pat. No. 5,115,202 to Brown has a PRBS generator and an oscillator that would create digital noise on the power supply. Similarly, another prior art reference, U.S. Pat. No. 5,506,545, is not implemented on a single integrated circuit chip, nor could it be, because of the crystal oscillator shown therein. The spread spectrum clock of the '545 patent is intended to be separate from the microprocessor that receives its spread spectrum output. Moreover, even if circuit of the '545 patent could be implemented on a single chip by changing its design and, for example, replacing Andrea's crystal oscillator with a conventional oscillator that can be implemented on an integrated circuit chip, the replacement conventional oscillator circuit would still create digital noise on the power supply. The present invention avoids these shortcomings of the prior art.

The embodiments described above are but examples of the present invention. Artisans will recognize that variations are possible.

I claim:

1. A chopper-stabilized operational amplifier implemented on a single integrated circuit chip comprising:
   an operational amplifier on said chip;
   a chopper-stabilizer circuit on said chip auxiliary to the operational amplifier, wherein the chopper-stabilizer circuit includes a chopper switch that oscillates between a first state and a second state, with an amount of time between each oscillation; and
   a clock signal generator circuit on said chip, wherein the clock signal generator circuit includes a first component that generates white noise voltages, the clock signal generator circuit outputs a first voltage signal derived from the white noise voltages, and the clock signal generator does not create digital noise on a power supply for said clock signal generator;
   wherein the first voltage signal is provided directly or indirectly to the chopper stabilizer circuit, and the amount of time between oscillations of the chopper switch varies randomly within a selected range based at least in part on the first voltage signal;
   wherein said clock signal generator circuit includes a symmetrical noise generator circuit and a symmetrical oscillator circuit; and
   wherein the noise generator circuit includes at least one differential amplifier that amplifies said white noise voltages, a bandpass filter that filters said amplified white noise voltages, and an integrator circuit in a feedback connection with said at least one differential amplifier.

2. The chopper-stabilized operational amplifier of claim 1, wherein the clock signal generator circuit draws a constant amount of DC current from the power supply.

3. The chopper-stabilized operational amplifier of claim 1, wherein the clock signal generator circuit draws a constant amount of DC current from the power supply.

4. A clock circuit implemented on a single integrated circuit chip for generating a randomized clocking signal that is provided to a second circuit on the same chip comprising:
   a component on said chip that generates white noise voltages;
   an amplifier on said chip that amplifies said white noise voltages;
   a bandpass filter on said chip that filters said amplified white noise voltages;
   an oscillator on said chip that receives the amplified and bandpass filtered white noise voltages, or a signal derived therefrom, and outputs said randomized clocking signal;
   wherein said randomized clocking signal oscillates between a first voltage state and a second voltage with a random amount of time between oscillations, said amount of time varying randomly within a selected range; and
   a second circuit on said chip that receives and utilizes said randomized clocking signal; and
   wherein said clock circuit does not create digital noise on a power supply for said clock circuit.

5. The clock circuit of claim 4, wherein the second circuit is a control for a chopper switch of a chopper-stabilized operational amplifier.

6. The clock circuit of claim 5, wherein said clock circuit further comprises an integrator circuit on said chip, wherein said integrator circuit is in a feedback connection to the amplifier.

7. The clock circuit of claim 4, wherein the first amplifier is a differential amplifier, and further comprising a second differential amplifier between said first amplifier and said bandpass filter.

8. The clock circuit of claim 7, further comprising a third differential amplifier between said second differential amplifier and said bandpass filter.

9. The clock circuit of claim 6, wherein the first amplifier is a differential amplifier, and further comprising a second differential amplifier between said first amplifier and said integrator circuit.

10. A clock circuit implemented on a single integrated circuit chip for generating a randomized clocking signal that is provided to a second circuit on the same chip comprising:
    a random signal generator circuit on said chip, wherein said random signal generator circuit includes a component that generates white noise voltages, and said a random signal generator outputs a first voltage signal derived from said white noise voltages having a random voltage value within a selected range of voltage values;
    an oscillator on said chip that receives the first voltage signal, or a signal derived therefrom, and outputs said randomized clocking signal;
    wherein said randomized clocking signal oscillates between a first voltage state and a second voltage with a random amount of time between oscillations, said amount of time varying randomly within a selected range; and
    a second circuit on said chip that receives and utilizes said randomized clocking signal; and
    wherein said clock circuit does not create digital noise on a power supply for said clock circuit.

11. The clock circuit of claim 10, wherein the second circuit is a control for a chopper switch of a chopper-stabilized operational amplifier.

12. A method of producing and utilizing on a single integrated circuit chip a randomized clocking signal that oscillates between a first voltage state and a second voltage state with a randomly varying amount of time between each oscillation comprising:
    creating white noise voltages on said integrated circuit chip;
    amplifying and bandpass filtering said white noise voltages to produce a first voltage signal, said first voltage signal having a randomly varying voltage value within a selected range of voltage values;

providing an oscillator on said integrated circuit chip, said oscillator capable of oscillating between a first state and second state;

inputting the first voltage signal or a signal derived therefrom into said oscillator;

controlling the oscillations of the oscillator with said first voltage signal or the signal derived therefrom, so that the oscillator oscillates between the first state and the second state with a randomly varying amount of time between each oscillation, wherein said amount of time varies randomly within a selected range;

generating said randomized clocking signal based on whether the oscillator is in the first state or the second state; and providing said randomized clocking signal to a second circuit on the same chip, and utilizing said randomized clocking signal within said second circuit; and wherein said randomized clocking signal is produced entirely within circuits on said chip that do not create digital noise on a power supply for said circuits.

13. A random voltage signal generator circuit implemented on a single integrated circuit chip for generating a first voltage signal having a random value within a selected range comprising:

a component on said chip that generates white noise voltages;

a first differential amplifier on said chip that amplifies said white noise voltages;

a bandpass filter on said chip that filters said amplified white noise voltages to produce said first voltage signal;

an integrator circuit in a feedback connection with said amplifier; and wherein said random signal generator circuit draws constant DC supply currents and does not generate digital noise on a power supply for said random signal generator circuit.

14. The random signal generator circuit of claim 13, further comprising a second differential amplifier on said chip between said first differential amplifier and said bandpass filter.

15. The random signal generator circuit of claim 14, further comprising a third differential amplifier on said chip between said second differential amplifier and said bandpass filter.

* * * * *